(12) United States Patent
Ferrant

(10) Patent No.: US 9,230,662 B2
(45) Date of Patent: Jan. 5, 2016

(54) EPROM CELL

(71) Applicant: Soitec, Crolles (FR)

(72) Inventor: Richard Ferrant, Esquibien (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/385,436

(22) PCT Filed: Feb. 11, 2013

(86) PCT No.: PCT/EP2013/052668
§ 371 (c)(1),
(2) Date: Sep. 15, 2014

(87) PCT Pub. No.: WO2013/139527
PCT Pub. Date: Sep. 26, 2013

(65) Prior Publication Data
US 2015/0042381 A1 Feb. 12, 2015

(30) Foreign Application Priority Data
Mar. 23, 2012 (FR) ...................................... 12 52601

(51) Int. Cl.
*H03K 19/177* (2006.01)
*G11C 16/10* (2006.01)
*G11C 16/04* (2006.01)

(52) U.S. Cl.
CPC .............. *G11C 16/10* (2013.01); *G11C 16/045* (2013.01); *H03K 19/1776* (2013.01)

(58) Field of Classification Search
CPC ........................... H03K 19/1776; H01L 27/115

USPC ...................................................... 326/38–41
See application file for complete search history.

(56) References Cited

U.S. PATENT DOCUMENTS

| | | | |
|---|---|---|---|
| 5,128,895 A * | 7/1992 | Park | 365/185.02 |
| 5,319,593 A * | 6/1994 | Wolstenholme | 365/185.05 |
| 6,002,610 A * | 12/1999 | Cong et al. | 365/185.05 |
| 6,166,955 A * | 12/2000 | Lu et al. | 365/185.18 |
| 2010/0277986 A1 | 11/2010 | Hung et al. | |

FOREIGN PATENT DOCUMENTS

| | | |
|---|---|---|
| EP | 2333833 A1 | 6/2011 |
| FR | 2987709 A1 | 9/2013 |
| FR | 2987710 A1 | 9/2013 |

OTHER PUBLICATIONS

International Search Report for International Application No. PCT/EP2013/052668 dated Apr. 16, 2013, 3 pages.
International Written Opinion for International Application No. PCT/EP2013/052668 dated Apr. 16, 2013, 3 pages.
International Preliminary Report on Patentability for International Application No. PCT/EP2013/052668 dated Sep. 23, 2014, 4 pages.

\* cited by examiner

*Primary Examiner* — Don Le
(74) *Attorney, Agent, or Firm* — TraskBritt

(57) ABSTRACT

The present invention relates to a register cell comprising one output node, at least two power supply nodes, and a first flash transistor and a second flash transistor, wherein the register cell is configured so that the output node can be driven by at least one of the power supply nodes as a function of the value stored in at least one of the flash transistors. The invention further relates to an FPGA comprising the register cell.

15 Claims, 3 Drawing Sheets

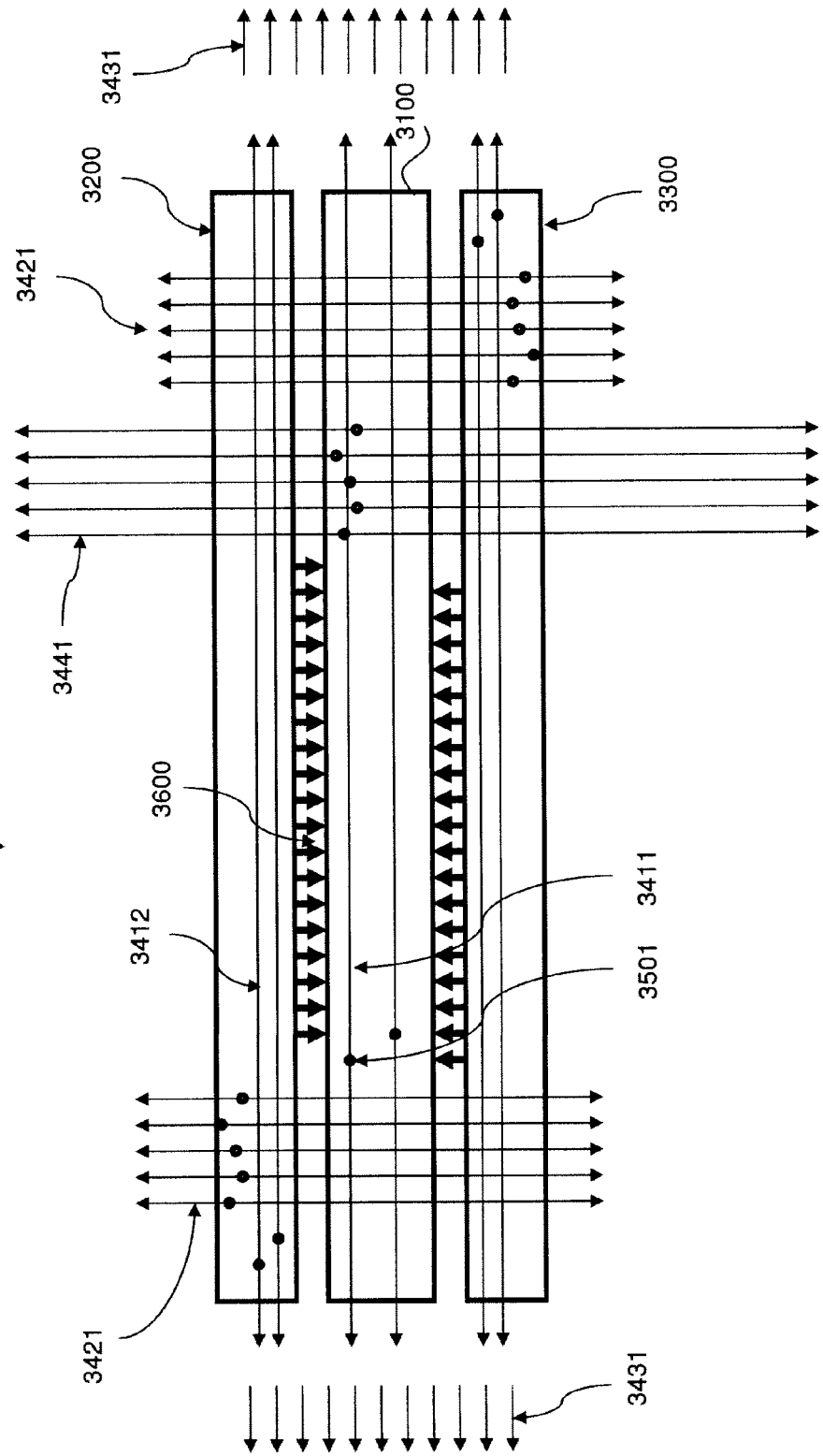

EPROM CELL

CROSS-REFERENCE TO RELATED APPLICATIONS

This application is a national phase entry under 35 U.S.C. §371 of International Patent Application PCT/EP2013/052668, filed Feb. 11, 2013, designating the United States of America and published in English as International Patent Publication WO 2013/139527 A1 on Sep. 26, 2013, which claims the benefit under Article 8 of the Patent Cooperation Treaty and under 35 U.S.C. §119(e) to French Patent Application Serial No. 1252601, filed Mar. 23, 2012, the disclosure of each of which is hereby incorporated herein in its entirety by this reference.

TECHNICAL FIELD

The present invention relates to a register cell comprising one output node, at least two power supply nodes, and a first flash transistor and a second flash transistor, wherein the register cell is configured so that the output node can be driven by at least one of the power supply nodes as a function of the value stored in at least one of the flash transistors. The invention further relates to an FPGA comprising the register cell.

BACKGROUND

In several electronic applications, it is often necessary to provide a register cell capable of driving a load with an appropriate voltage and/or current. This is particularly the case for FPGA applications in which the register cells for setting the behavior of FPGA provide a signal, which may go through several pass gates before eventually driving the output load of the FPGA. Accordingly, a register cell having an appropriate driving voltage and/or current is needed.

This usually prevents the usage of flash register cells for FPGA applications. In particular, flash register cells are known to have a high impedance and thus a low driving voltage and/or current.

BRIEF SUMMARY

The present invention solves this problem by providing a register cell that is capable of providing the appropriate driving current and/or voltage for applications such as an FPGA setting.

In particular, an embodiment of the present application can relate to a register cell comprising: one output node, at least two power supply nodes, and a first flash transistor and a second flash transistor, wherein the register cell can be configured so that the output node can be driven by at least one of the power supply nodes as a function of the value stored in at least one of the flash transistors.

This provides the beneficial advantage of driving the output of the register cell with current and voltage being provided by the power supply nodes and controlled by the flash transistors. In this manner, the flash transistors can retain the value stored in the register cell while the actual driving current of the register cell's output is not provided by the flash transistors directly, but indirectly by means of the power supply nodes. In this manner, an appropriate current and/or voltage driving capability can be ensured at the output of the register cell.

In advantageous embodiments, the first flash transistor can be connected between a first power supply node and the output node, and the second flash transistor can be connected between a second power supply node and the output node, and the register cell can be configured so that current flowing to and/or from the output node flows through at least one of the flash transistors.

This provides the beneficial advantage of controlling the flowing of the current from the poser supply nodes to the output of the register cell in a simple and effective way, thereby reducing the number of necessary components.

In advantageous embodiments, the first flash transistor can be separated from the first power supply node by a first transistor and from the second power supply node by a second transistor, and the second flash transistor can be separated from the second power supply node by a third transistor, and wherein the register cell can be configured so that the flash transistors are programmed by controlling the first and/or second and/or third transistor.

This provides the beneficial advantage of allowing programming of the flash transistors using the same current path used for the driving of the register cell's output, thereby reducing the number of components necessary for the programming of the register cell.

In advantageous embodiments, the first flash transistor can be programmed by flowing a programming current through it via the second transistor, and/or the second flash transistor can be programmed by flowing the programming current through it via the third transistor.

This provides the beneficial advantage of allowing programming of the two flash transistors by only using three additional transistors.

In advantageous embodiments, the register cell can further comprise a fourth transistor and the register cell can be configured so that the programming current further flows through the fourth transistor.

This provides the beneficial advantage of allowing a patch for the current to flow out of the register cell during programming mode, without using the path connected to the output node.

Moreover, the present invention can relate to an FPGA comprising a plurality of pass gates and a plurality of register cells in accordance with any of the previous claims.

This provides the beneficial advantage of realizing a compact and regular FPGA architecture in which the pass gates and the output of the FPGA can be driven directly by the register cell without the need for additional signal repeaters.

BRIEF DESCRIPTION OF THE DRAWINGS

The invention will be described in more detail by way of example hereinafter using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be left out. In the drawings:

FIG. 3 schematically illustrates an architecture for a lookup table using the register cell of FIG. 1 in accordance with an embodiment of the present invention.

DETAILED DESCRIPTION

Figure 1:
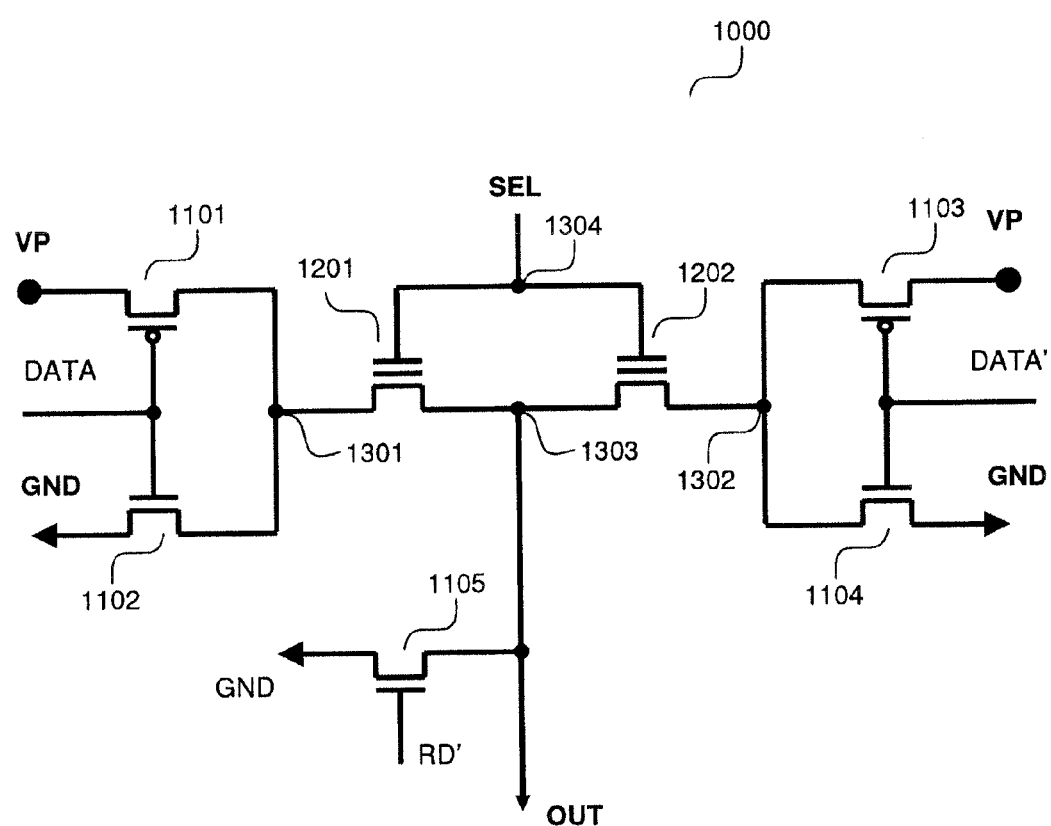
FIG. 1 schematically illustrates a register cell in accordance with an embodiment of the present invention.

FIG. 1 schematically illustrates a register cell 1000 in accordance with an embodiment of the present invention. Register cell 1000 comprises transistors 1101-1105 as well as flash transistors 1201 and 1202. Transistors 1101-1105 may be, for instance, high voltage transistors. In particular, they may be capable of handling voltages in the range of 10V to 20V, preferably 15V. Moreover, any of transistors 1101-1105, 1201, and 1202 could be realized by any multi-gate transistor technology, such as FET on SOI with a back gate under the Buried Oxide Layer, and/or fin-FETs, and/or tri-gate FETs, etc.

More specifically, transistor 1101 is a PMOS-type transistor that has its source connected to power supply node VP. Transistor 1102 is an NMOS transistor with its source connected to the power supply node GND. The gate of both transistors 1101 and 1102 is connected to the signal DATA. The drain of both transistors 1101 and 1102 is connected to a common node 1301, which is itself connected to the drain/source of flash transistor 1201.

The voltage level applied to power supply node VP is higher than the voltage level applied to power supply node GND. The voltage difference between nodes VP and GND may be dependent on the operation carried out by the register cell 1000, as will be described later.

Similarly, transistor 1103 is a PMOS-type transistor that has its source connected to power supply node VP. Transistor 1104 is an NMOS transistor with its source connected to the power supply node GND. The gate of both transistors 1103 and 1104 is connected to the signal DATA'. The signal DATA' is, during operation of the register cell 1000, usually associated with the negated version of the signal DATA. The drain of both transistors 1103 and 1104 is connected to a common node 1302, which is itself connected to the drain/source of flash transistor 1202.

Transistor 1105 is an NMOS-type transistor and has its gate connected to the signal RD', the source connected to the power supply node GND and the drain connected to the node 1303, which is itself connected to the drain/source of both flash transistors 1201 and 1202.

Although in this particular embodiment an NMOS transistor is used for transistor 1105, the present invention is not limited thereto and it could be implemented by using a PMOS transistor instead, or any means for connecting the power supply node GND to the node 1303.

Finally, the gate of both flash transistors 1201 and 1202 is connected to a common node 1304 connected to a signal SEL, while the common node 1303 is connected to the output OUT of the register cell 1000.

In the following, the behavior of the register cell 1000 will be illustrated for the programming mode, erase operation, retention mode, and reading mode.

In the programming mode, both for the programming of a 1 or a 0 within register cell 1000, the voltage difference between the nodes VP and GND is set at a value VPP, which could be in the range of 10V to 20V, preferably 15V. The same value is used for the erase operation. However, the present invention is not limited thereto and a different value could be used instead.

In order to set a digital value of 1 in the register cell 1000, the signals are set as:
DATA=high
DATA'=low
SEL=HV
RD'=high Here, the terms "high" and "low" are employed as meaning "high enough" to turn on the transistor and "low enough" to turn off the transistor, respectively, in the case of an NMOS transistor. The opposite holds for a PMOS transistor.

The term "HV" means a voltage level high enough to allow programming of the flash transistors, when current is flowing through the transistors, by storing charges into the floating gate.

By using this signal combination, transistors 1102 and 1103 are turned on, i.e., conducting, while transistors 1101 and 1104 are turned off, i.e., not conducting. This implies that node 1301 is set at a voltage value corresponding to the voltage applied to node GND, while point 1302 is set at a voltage value corresponding to the voltage applied to node VP. Moreover, since RD' is set high, transistor 1105 is turned on, thereby connecting the node 1303 to node GND.

At the same time, by setting the SEL signal at a voltage value of HV, both flash transistors 1201 and 1202 are turned on, i.e., made conducting, and in a state in which they can be programmed by storing charges into the floating gate.

In this manner, it is possible to change the threshold voltage of flash transistor 1202. In particular, since both nodes 1301 and 1303 are at the same voltage level, no current will flow through flash transistor 1201. However, since nodes 1302 and 1303 are connected, respectively, to VP and GND, current will flow through flash transistor 1202. The voltage levels are chosen so as to create hot electrons that are trapped into the floating gate of flash transistor 1202. In this manner, the threshold voltage of flash transistor 1202 drops due to the accumulation of stored charges.

By doing so, the threshold voltage of the transistor 1202 is lowered. In such a manner, assuming the original threshold voltage for both flash transistors 1201 and 1202 was at a higher value, a value of 1 is recorded in the register cell 1000.

In the following, the setting of a digital value corresponding to 0 will be described. In order to set a digital value of 0 in the register cell 1000, the signals are set as:
DATA=low
DATA'=high
SEL=HV
RD'=high Accordingly, the transistors 1101 and 1104 are turned on, i.e., conducting, while transistors 1102 and 1103 are turned off, i.e., not conducting. This implies that node 1301 is set at a voltage value corresponding to the voltage applied to node VP, while node 1302 is set at a voltage value corresponding to the voltage applied to node GND.

Moreover, since RD' is set at high, transistor 1105 is turned on, thereby connecting the node 1303 to GND.

The SEL signal being at a voltage value of HV, both flash transistors 1201 and 1202 are turned on, i.e., made conducting. In this manner, it is possible to change the threshold voltage of flash transistor 1201.

In particular, symmetrically with respect to the setting of 1, since both nodes 1302 and 1303 are at the same voltage level GND, no current will flow through flash transistor 1202. However, since nodes 1301 and 1303 are set, respectively, at the voltage applied to node VP and the voltage applied to node GND, current will flow through flash transistor 1201. The voltage levels are chosen so as to create hot electrons that are trapped into the floating gate of flash transistor 1201. In this manner, the threshold voltage of flash transistor 1201 drops due to the accumulation of stored charges in its floating gate.

By doing so, the threshold voltage of the transistor 1201 is lowered such that it will be on, i.e., conducting, during the read operation. In such a manner, assuming the original threshold voltage for both flash transistors was at a higher value, a value of 0 is recorded in the register cell 1000.

Although this embodiment has been described by setting a value of 1 and/or 0 by means of lowering the threshold voltage of one of the two transistors, the present invention is not limited thereto. Alternatively, or in addition, this value could be set by increasing the threshold voltage of one of the two transistors.

In order to erase the value stored in register cell 1000, the signals set as:
DATA=high
DATA'=high
SEL=−HV
RD'=high In this manner, nodes 1301, 1302 and 1303 are set at a voltage level equal to the voltage applied to node GND. By applying the negative voltage −HV on the SEL signal, the value stored in the floating gate of the flash transistors 1201 and 1202 is erased.

In particular, the negative amplitude of the SEL signal is high enough to let the stored electrons go through the gate by tunneling, thereby restoring the original higher threshold of both flash transistors 1201 and 1202 to its original level.

Although the value of −HV has been described in the present embodiment, the value of signal SEL for the erasing process does not need to be symmetrical with respect to the value of +HV used for the programming of the register cell. In particular, any voltage low enough so as to delete the value stored in the flash transistors 1201 and 1202, thereby resetting them to the starting higher level of threshold voltage, can be applied to the signal SEL.

In the following, the retention process will be described. In the retention mode, as well as in the reading mode, both for the reading of a 1 or a 0, the voltage difference between the nodes VP and GND is set at a value VHH.

When the register cell is used in order to drive a look-up table implemented with multi-gate transistors, such as the one described in French patent application FR1252002, VHH could be, for instance, in the range of approximately one to two times the nominal VDD value of the multi-gate transistors realizing the pass gates of the look-up table. For instance, in case of fin-FETs being used for realizing the pass gates, a VHH value corresponding to the VDD of the fin-FETs is sufficient. In the case of FDSOI, a higher voltage may be needed to compensate for the potential asymmetry of the transistor.

In order to set the register cell into retention mode, the signals are set as:
DATA=high
DATA'=low
SEL=low
RD'=low By setting SEL at a low value, for instance, 0V, the flash transistors 1201 and 1202 are both blocked, i.e., not conducting, independently on the value stored in the register cell 1000. In other words, the value used for SEL is low such that, even if one of the flash transistors 1201 or 1202 has a lowered threshold voltage, following the storing of a 1 or a 0 in the register cell 1000, the transistor 1201 or 1202 will still not be conducting.

In this manner, the output node OUT will be floating and the value stored in the register cell 1000 is retained.

Although the signals DATA and DATA' have been described as being set to high and low, respectively, the present invention is not limited thereto and could also be implemented, for instance, by setting DATA and DATA' to low and high, respectively. More generally, the signals DATA and DATA' may not need to be driven at all during the retention mode and could be left floating.

Alternatively, or in addition, in the case where register cell 1000 is used in applications in which the output OUT of the register cell 1000 is discarded during the retention mode, for instance, if the output of the register cell 1000 is only connected to other nodes during the reading operation, the signal RD' could also be set at any value and/or be left floating.

Alternatively, or in addition, the signal RD' could be used so as to implement a stable value on the output node OUT during retention. For instance, by setting RD' to a high value, the transistor 1105 would be turned on, i.e., conducting, and the output node OUT would be stably set at a value of GND during retention mode.

The voltage difference between nodes VP and GND has been defined as being set at a value VHH for both retention and reading, but the invention is not limited thereto. The advantage of using a common value VHH for retention and reading is in the fact that, once the register cell has been programmed, for instance, during a specific initialization procedure, the register cell 1000 can subsequently be operated with a single power supply voltage value for the node VP corresponding to VHH. However, a different voltage difference could be used in the two processes, if needed.

Further, alternatively, or in addition, during retention mode, the voltage difference between VP and GND could be set at any value, since both flash transistors 1201 and 1202 are not conducting.

In the following, the reading operation will be described. In order to read a digital value stored in the register cell 1000, the signals are set as:
DATA=high
DATA'=low
SEL=Vread
RD'=low Accordingly, the transistors 1102 and 1103 are turned on, i.e., made conducting, while transistors 1101 and 1104 are turned off, i.e., made not conducting. This implies that node 1301 is set at a voltage value corresponding to the voltage applied to node GND, while node 1302 is set at a voltage value corresponding to the voltage applied to node VP.

The voltage applied on the SEL signal is set at a value Vread, which is high enough to make the flash transistor 1201 and/or 1202 conducting when its voltage threshold has been lowered by the setting of a value of 1 or 0 in the register cell 1000, but low enough so as to avoid making the transistor 1201 or 1202 conducting when its threshold is set at the higher original value.

Accordingly, in the case where 1 has been stored in the register cell 1000, the flash transistor 1202 has a lowered threshold voltage, while the flash transistor 1201 has a standard, higher, threshold voltage. By applying the Vread voltage potential on the SEL node, the flash transistor 1202 is made conducting so that the nodes 1302 and 1303 are connected. In this manner, the output node is raised at a voltage level VHH', which may differ from the voltage VHH applied at node VP due to the substrate effect of the transistor. In this manner, the stored value of 1 is presented at the output node OUT.

Similarly, when a value of 0 has been stored in register cell 1000, the flash transistor 1201 has a lowered threshold voltage, while the flash transistor 1202 has a standard, higher, threshold voltage. By applying the Vread voltage potential on the SEL node, the flash transistor 1201 is made conducting so that the nodes 1301 and 1303 are connected. In this manner, the output node is driven at the voltage level applied to node GND, thereby presenting the stored value of 0 at the output node OUT.

This is advantageous since the output node OUT is not driven directly by the value stored in the flash transistors 1201 and/or 1202, but indirectly via this stored value, by making use of the power supply voltages available at nodes GND and VP. In this manner, it is not necessary to amplify the output voltage provided by the flash transistor via a sense amplifier. To the contrary, a strong signal can be directly obtained, having the required current and/or voltage characteristics provided by the power supply voltages applied at nodes GND and VP.

Accordingly, the register cell 1000 can be successfully used to drive applications requiring a level of voltage and/or current that could not be generated by the flash transistors 1201 and 1202 on their own. In particular, this makes the register cell suitable for use in FPGA applications, where the signal provided on the output node OUT may have to cross several pass gates and still be sufficiently strong to drive the output of the FPGA.

Although in the above-mentioned embodiment the same voltage difference has been described as being between nodes VP and GND connected to transistors 1101 and 1102 and between nodes VP and GND connected to transistors 1103 and 1104, the present invention is not limited thereto. In particular, the two voltage differences could be different for any given operation state of the register cell 1000.

For instance, during the reading operation in the above-mentioned embodiment, if the register cell stores a value of 0, flash transistor 1201 will be conducting between the output node OUT and the power supply voltage node GND. Accordingly, the value of the voltage at node VP connected to transistor 1101 is irrelevant. In particular, this node could be set at any given voltage, including the same as GND, VHH or VPP. At the same time, since the node VP connected to transistor 1103 is driving the output OUT, if the register cell 1000 stores a value of 1, the voltage potential on this node could be set at VPP, or VHH, or any other voltage value, depending on the voltage requirements on the output node OUT.

The usage of VPP for the node VP connected to transistor 1101 may be advantageous, since it would require this node to have a single connection to VPP, and not a switchable connection between VPP and VHH.

Figure 2A:
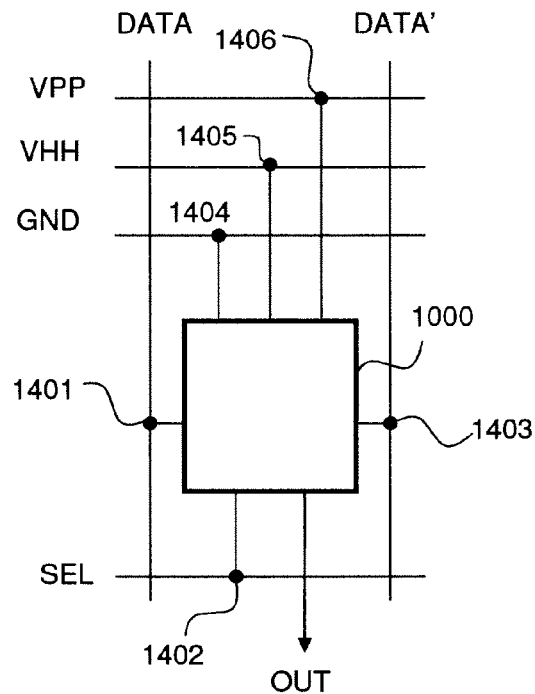
FIG. 2A schematically illustrates the external connections of the register cell of FIG. 1 in accordance with an embodiment of the present invention.

FIG. 2A schematically illustrates the external connections of the register cell 1000 of FIG. 1 in accordance with an embodiment of the present invention.

In particular, as can be seen in FIG. 2A, the register cell 1000 has external connections 1401-1406 connected to, in order, signals DATA, SEL, DATA', GND, VHH and VPP. It will be appreciated by those skilled in the art that several ways exist for connecting any of the internal nodes VP to any of VHH and/or VPP power supply voltages via connections 1405 and 1406, depending on the operation of the register cell 1000. The specific implementation can be varied, as long as connection to the required voltage value is achieved for the VP nodes depending on the operation status of the register cell 1000.

As can be seen in FIG. 2A, the routing of signals DATA, SEL, DATA', GND, VHH and VPP can be achieved by using only two routing layers, such as two metal levels. Moreover, the routing can be realized in such a way that a plurality of register cells 1000 can be closely arranged in a regular and compact architecture. This is illustrated in FIG. 2B.

Figure 2B:
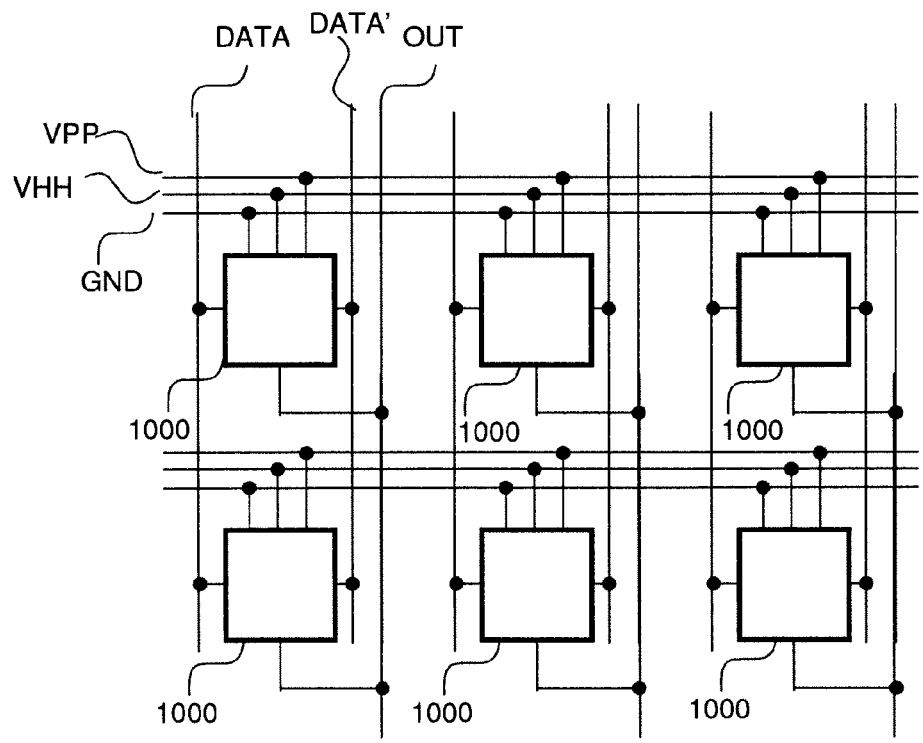
FIG. 2B schematically illustrates the connection of a plurality of register cells in accordance with an embodiment of the present invention.

FIG. 2B schematically illustrates the connection of a plurality of register cells 1000 in accordance with an embodiment of the present invention. For ease of illustration, the SEL signal line has not been represented. It will be clear to those skilled in the art that the SEL signal line can be realized as illustrated in FIG. 2A in parallel to the VPP, VHH and GND signal lines.

As can be seen in the figures, a plurality of register cells 1000 can be placed in a matrix placement. The matrix is not limited in terms of number of lines and/or rows.

Such a placement is advantageous as it provides flexibility in the horizontal pitch of the output signals OUT. In particular, the pitch can be narrower than the pitch of the register cell 1000, since a plurality of rows can be realized.

In particular, such an arrangement of register cells can be advantageous when employed together with the look-up table described in French patent application FR1252002 and/or so as to realize a look-up table architecture described in French patent application FR1252003. Both the patent applications FR1252002 and FR1252003 are hereby incorporated by reference in their entirety. Such a placement achieved a compact and regular layout for a look-up table wherein the register cells can directly drive the pass gates of the look-up table.

FIG. 3 schematically illustrates an architecture for a look-up table using the register cell 1000 of FIG. 1 in accordance with an embodiment of the present invention.

Look-up table architecture 3000 comprises a programmable logic part 3100, and register cell groups 3200 and 3300. In particular, the register cell groups 3200 and/or 3300 can be realized by a plurality of register cells 1000 arranged, for instance, in the manner illustrated in FIG. 2B. Within the programmable logic part 3100, a plurality of pass gates is arranged, wherein the pass gates are controlled by the signals issued by the register cells within register cell groups 3200 and 3300.

Thanks to the placement of the pass gates so as to realize a horizontally elongated shape for the programmable logic part 3100, it is possible to efficiently combine the programmable logic part 3100 and the register cell groups 3200 and 3300 in a dense manner. In fact, such placement of the pass gates allow the register cell to be placed near the pass gates, thereby avoiding complex routing and empty silicon area.

In the following, the placement of, and the connection between, the programmable logic part 3100 and the register cell groups 3200 and 3300 will be described.

Metal 1 connection lines, such as connection line 3411, provide connections 3501 to the internal nodes of the programmable logic part 3100, such as power supplies, and/or to internal interconnections to the input signals, and/or connection to the output nodes, etc.

For ease of illustration, only connection 3501 has been referenced. It will be clear to those skilled in the art that other exemplary connections are similarly indicated with circular dots in FIG. 3. Additionally, the number and placement of connection lines, such as line 3411, is indicated as exemplary only and will depend, among others, on the position and number of physical nodes to which connection is required, and/or on the size of the programmable logic 3100 and register cell groups 3200, 3300.

Alternatively, or in addition, metal 1 connection lines, such as connection line 3412, provide connections for register cell groups 3200 and/or 3300. For instance, connection line 3412 can be used in order to decode, i.e., select, one or more register cells from register cell group 3200. By selecting the register cell, it is possible, for instance, to store one value within the register cell, so as to configure the look-up table architecture 3000. With reference to register cell 1000, the selection is operated by the signal SEL, while connection line 3412 could be, for instance, any of VPP, VHH, and/or GND, etc.

The placement of the programmable logic 3100 along the register cell groups 3200 and/or 3300, therefore, advantageously allows a single metal level, in this case metal 1, to be used both for realizing connections within the programmable logic 3100 and within the register cell groups 3200 and/or 3300.

Additionally, such a placement allows the connections 3600 from the register cell groups 3200 and 3300 to the programmable logic 3100 to propagate the register cell signals with a simple routing. These connections may correspond to the plurality of OUT signals issued by the plurality of register cells 1000 within the register cell groups 3200 and 3300. Connections 3600 can be realized in metal level 1 or 2, or in a polysilicon level, or an equivalent connection level below the metal levels.

In particular, it is possible to place the register cells in a manner substantially aligned with the respective pass gates. This provides a simple routing for the register cell signals and a scalable design.

Additionally, the placement of the register cells is not limited to one register cell group above the programmable logic 3100 and one register cell group below, etc. Any combination may be used; for instance, two register cell groups above and two register cell groups below; one register cell group above and two below, etc. In particular, if the register cells are designed so that they can be effectively grouped in groups of two, it may be advantageous to place them in two groups above the programmable logic, two groups below, two groups above, and so on.

For instance, with reference to FIG. 2A, register cells could be placed so as to share the connection lines VPP, VHH and GND, by placing one group of register cells 1000 below those lines and one group of register cells 1000 above those lines.

A further metal level, for instance, metal 2, is used for connection lines, such as connection line 3421, so as to provide data connections for register cell groups 3200 and/or 3300, in order to configure the look-up table architecture 3000. This can correspond, for instance, to the DATA and DATA' connection lines of register cells 1000.

Thanks to the above-described two levels of metal, the operation of the look-up table architecture is achieved. More specifically, by using only two metal levels, it is possible to program the register cells so as to program the behavior of the look-up table architecture 3000 and to provide power to the look-up table.

Connection line 3431 and/or 3441 can, therefore, be used to interconnect internal nodes of programmable logic 3100 to other nodes in the nearby circuits. Alternatively, or in addition, they can be used to connect the output of the look-up table acting as programmable logic 3100 to the output of the circuit including look-up table architecture 3000. Still alternatively, or in addition, they can be used to connect to other nodes, such as nodes of another look-up table architecture 3000.

Connection line 3431 can be realized on metal 1, or any metal other than metal 2, due to the crossing with connection line 3421 in metal 2. Symmetrically, connection line 3431 can be realized on metal 2, or any metal other than metal 1, due to the crossing with connection line 3411 in metal 1.

Such an arrangement for look-up table architecture 3000 is advantageous as it is regular, thereby simplifying routing, timings, parasitic capacitances management, manufacturing, error detections, and scalability.

Although the present embodiment has been illustrated as including two register cells groups 3200 and 3300, the present invention is not limited thereto. In particular, the invention can also be realized with a single group of register cells, such as register cell group 3200 only, as described above. Alternatively, or in addition, one or more further register cell groups placed above register cell group 3200 and/or below register cell groups 3300, could be implemented. For instance, the register cells could be provided in a staggered manner, but all on one side of the programmable logic 3100, resulting in register cell groups 3200 and 3300 being one above the other.

Furthermore, although the embodiment has been illustrated with reference to horizontal placement for odd metal lines and vertical placement for even metal lines, this is an example only. Alternatively, or in addition, the directions of the metal lines could be opposite, that is, horizontal placement for even metal lines and vertical placement for odd metal lines. Still alternatively, or in addition, all metal lines could be either horizontal or vertical. In general, any metal line can have any directivity, such as horizontal, vertical, 45 degrees, etc.

Additionally, although metal levels have been described as metal 1, metal 2, etc., this is not limiting the present invention. More specifically, any metal level could be swapped with any other, as it will clearly appear to those skilled in the art.

Further, a circuit comprising a plurality of programmable logic blocks 3100, interleaved by register cell groups 3200 and/or 3300, can be realized as described in French patent application FR1252003. However, the present invention is not limited thereto. Alternatively, or in addition, the circuit could comprise a plurality of programmable logic blocks 3100 interleaved by only one register cell group 3200, 3300.

Still alternatively, or in addition, the sequence of programmable logics and register cell groups could comprise a first register cell group issuing register cell signals for a first programmable logic, the first programmable logic, a second programmable logic and a second register cell group issuing register cell signals for the second programmable logic. In particular, this could be advantageous if, for instance, the first and second programmable logics were placed in a horizontally symmetrical manner, so as to share a common connection to a voltage power supply. A similar placement could be realized for register cell groups 3200 and 3300, so as to share a common power supply connection such as GND, VPP and/or VHH.

Additionally, a further circuit could comprise a standard cell block placed between two look-up tables 3000 and connected to any of those look-up tables via any metal level. Advantageously, since metal levels 1 and 2 can be used for the routing of the look-up tables, the same metal level layers can be reserved for the internal routing of the standard cell block, while the remaining metal levels can be used to interconnect the standard cell block with any of the look-up tables 3000, or with any other node in the circuit.

In particular, standard cell block can be realized by using the teaching disclosed in European Patent Application EP 2 333 833 A1. This is advantageous since the standard cells disclosed in the document can be regularly arranged in forms of rows. Such a regular placement for the standard cell block, in addition to the regular placement for the look-up tables 3000 comprising the register cells 1000, provides a compact, yet dense layout.

Furthermore, a regular arrangement as described above allows for a regular placement of power supply nodes and connection lines, which results in a simplified management of voltage drop over the layout's surface.

Although several embodiments have been described, they are not to be considered independently. In particular, features from different embodiments can be combined, within the scope of the invention as defined by the claims.

The invention claimed is:

1. A register cell comprising:
   one output node;
   at least two power supply nodes;
   a first flash transistor and a second flash transistor, the first flash transistor connected between a first power supply node and the output node, the second flash transistor connected between a second power supply node and the output node;
   a first transistor separating the first flash transistor from the first power supply node;
   a second transistor separating the first flash transistor from the second power supply node; and
   a third transistor separating the second flash transistor from the second power supply node;
   wherein the register cell is configured so that the output node can be driven by at least one of the power supply nodes as a function of the value stored in at least one of the flash transistors, the register cell is configured so that current flowing to and/or from the output node flows through at least one of the flash transistors, and the register cell is configured so that the flash transistors are programmed by controlling at least one of the first transistor, the second transistor, and the third transistor.

2. The register cell of claim 1, wherein
   the first flash transistor is programmed by flowing a programming current through it via the second transistor, and
   the second flash transistor is programmed by flowing the programming current through it via the third transistor.

3. The register cell of claim 2, further comprising a fourth transistor and wherein the register cell is configured so that the programming current further flows through the fourth transistor.

4. An FPGA comprising a plurality of pass gates and a plurality of register cells in accordance with claim 1.

5. The register cell of claim 1, wherein:
   the first flash transistor is separated from the first power supply node by a first transistor and from the second power supply node by a second transistor, and the second flash transistor is separated from the second power supply node by a third transistor, and
   wherein the register cell is configured so that the flash transistors are programmed by controlling the first and/or second and/or third transistor.

6. The register cell of claim 1, wherein
   the first flash transistor is programmed by flowing a programming current through it via the second transistor, or
   the second flash transistor is programmed by flowing the programming current through it via the third transistor.

7. The register cell of claim 3, wherein the first transistor comprises an N-MOS transistor, and the second transistor comprises a P-MOS transistor.

8. The register cell of claim 7, wherein a drain of the first transistor and a drain of the second transistor are connected to a common node, the common node being connected to at least one of a source and a drain of the first flash transistor.

9. The register cell of claim 8, wherein the third transistor comprises a P-MOS transistor, and the fourth transistor comprises an N-MOS transistor.

10. The register cell of claim 9, wherein a drain of the third transistor and a drain of the fourth transistor are connected to another common node, the another common node being connected to at least one of a source and a drain of the second flash transistor.

11. The register cell of claim 10, wherein a gate of each of the first transistor and a gate of the second transistor are each connected to a first signal line, and wherein a gate of each of the third transistor and a gate of the fourth transistor are each connected to a second signal line.

12. The register cell of claim 11, wherein the second signal line is a negated version of the first signal line during operation of the register cell.

13. The register cell of claim 3, further comprising a fifth transistor having a gate connected to a signal line, and a source connected to one power supply node of the at least two power supply nodes, and a drain connected to at least one of the source and drain of each of the first flash transistor and the second flash transistor and to the output node.

14. The register cell of claim 3, wherein a gate of the first flash transistor and a gate of the second flash transistor are each connected to a signal line.

15. The register cell of claim 1, wherein a voltage difference between the two power supply nodes is dependent on an operation carried out by the register cell.

* * * * *